(12) United States Patent
Pereira Rivas et al.

(10) Patent No.: US 12,413,121 B2
(45) Date of Patent: Sep. 9, 2025

(54) SEMICONDUCTOR DEVICE

(71) Applicant: ELDOR CORPORATION S.P.A., Orsenigo (IT)

(72) Inventors: Javier Eduardo Pereira Rivas, Turin (IT); Luca Zai, Turin (IT); Pasquale Forte, Castiglione d'Orcia (IT); Michele Roman, Noventa di Piave (IT)

(73) Assignee: ELDOR CORPORATION S.P.A., Orsenigo (IT)

( * ) Notice: Subject to any disclaimer, the term of this patent is extended or adjusted under 35 U.S.C. 154(b) by 599 days.

(21) Appl. No.: 17/778,060

(22) PCT Filed: Nov. 12, 2020

(86) PCT No.: PCT/IB2020/060637
§ 371 (c)(1),
(2) Date: May 19, 2022

(87) PCT Pub. No.: WO2021/099894
PCT Pub. Date: May 27, 2021

(65) Prior Publication Data
US 2022/0416628 A1    Dec. 29, 2022

(30) Foreign Application Priority Data
Nov. 20, 2019 (IT) .................. 102019000021702

(51) Int. Cl.
*H02K 11/33* (2016.01)
*H10D 84/83* (2025.01)
(Continued)

(52) U.S. Cl.
CPC .............. *H02K 11/33* (2016.01); *H10D 84/83* (2025.01); *H10D 30/60* (2025.01); *H10D 64/519* (2025.01); *H10D 89/10* (2025.01)

(58) Field of Classification Search
CPC .............. H01L 27/088; H01L 27/0207; H01L 29/4238; H01L 29/78; H02K 11/33;
(Continued)

(56) References Cited

U.S. PATENT DOCUMENTS 4,313,126 A * 1/1982 Krumm ............... H01L 29/4175
257/E29.127
5,751,033 A * 5/1998 Miya ..................... H03D 7/125
257/E29.264

(Continued)

OTHER PUBLICATIONS

International Search Report and Written Opinion dated Feb. 15, 2021 from counterpart International Patent Application No. PCT/IB2020/060637.

*Primary Examiner* — Michael M Trinh
(74) *Attorney, Agent, or Firm* — SHUTTLEWORTH & INGERSOLL, PLC; Timothy J. Klima

(57) ABSTRACT

A semiconductor device including at least one substrate, a plurality of connection pairs, each equipped with a first connection electrode and a second connection electrode and connected to the terminals of a phase or to the ends of a phase fraction, one or more first control electrodes operatively placed between the connection pairs and configured to arrange the pairs in a first electrical configuration and one or more second control electrodes operatively placed between the connection pairs and configured to arrange them in a second electrical configuration.

17 Claims, 3 Drawing Sheets

(51) Int. Cl.
  *H10D 30/60* (2025.01)
  *H10D 64/27* (2025.01)
  *H10D 89/10* (2025.01)

(58) Field of Classification Search
  CPC ........ H02K 11/28; H02K 11/20; H10D 30/60; H10D 64/519; H10D 89/10; H10D 84/83; H10D 84/8311; H10D 84/8312; H10D 84/83135; H10D 84/83138; H10D 84/8314; H10D 84/8316; H10D 84/833; H10D 84/835; H10D 84/836; H10D 84/837; H10D 84/839
  See application file for complete search history.

(56) References Cited

U.S. PATENT DOCUMENTS

| | | | | |
|---|---|---|---|---|
| 6,002,301 | A | * | 12/1999 | Sugimura ............... H03F 3/601 |
| | | | | 257/E29.264 |
| 2015/0145030 | A1 | | 5/2015 | Meiser et al. |
| 2018/0181099 | A1 | | 6/2018 | Steinbach |
| 2020/0091913 | A1 | * | 3/2020 | Kanagawa ............. H03K 19/20 |
| 2022/0190691 | A1 | * | 6/2022 | Zai ......................... H02K 11/28 |

* cited by examiner

SEMICONDUCTOR DEVICE

This application is the National Phase of International Application PCT/IB2020/060637 filed Nov. 12, 2020 which designated the U.S.

This application claims priority to Italian Patent Application No. 102019000021702 filed Nov. 20, 2019, which application is incorporated by reference herein.

This invention relates to a semiconductor device, preferably a semiconductor device to be used for controlling an electric motor.

This invention therefore finds particular application in the connection of loads and/or circuits that require configuration variability.

The term "loads" is used in this text to define any type of circuit, including a single element or conductor, used in the manufacture of electrical/electronic equipment, such as electric motors, electromechanical drives, and computer circuitry.

In the field of electric propulsion, for example, the desire has long been felt to extend the working range of the electric motor, maximising its efficiency in the different regions in order to maximise performance and broaden its uses.

In this respect, to date, some methods are known, which exploit a suitable subdivision of the stator winding in different sections that can be selectively combined with each other in order to vary the motor "configuration", thus being able to adapt it to the working conditions and extend its working range.

One of these solutions is known from the U.S. Pat. No. 7,602,137, concerning an electromechanical tool (i.e. a drill) electrically driven and provided with a stator equipped with multiple windings with a reconfigurable arrangement.

In particular, this device is provided with multiple switches joined to each stator phase, each one of which can be controlled via a control unit between different positions to determine an electrical configuration of the motor more suitable for generating high speeds or high torques.

A similar, much earlier solution is also known for the automotive sector and is based on Eckart Nipp's doctoral thesis, which described a reconfigurable electric machine capable of achieving good performance under various operating conditions.

Both the above-mentioned solutions, only illustrated on paper, have found limited application on the market, mainly due to their implementation/construction difficulties.

It should be noted in this regard that, even considering an embodiment with only one switching possibility (e.g. star/triangle), the E. Nipp solution requires at least 5 independently controlled switches—a figure that grows exponentially (14!) if an additional switching possibility is to be included.

Disadvantageously, the presence of numerous switches to be controlled independently of each other makes the stator structure particularly complex and expensive, as well as not very reliable in light of the multiplicity of non-redundant elements.

The purpose of this invention is, therefore, to provide a semiconductor device that is able to overcome the drawbacks of the prior art described above.

In particular, the purpose of this invention is to provide a switching device for an electric motor that is easy to drive and, at the same time, smaller in size.

In addition, the purpose of this invention is to provide a switching device for an electric motor that combines high performance with increased electric efficiency.

Said purposes are achieved with a semiconductor device, as well as with a switching device, and with an electric motor, that have features as disclosed herein.

The semiconductor device according to the invention is designed to connect multiple loads according to a plurality of different electrical configurations, varying the field of application and/or efficiency of the loads according to the application.

As already mentioned in the introduction, the applications of this semiconductor device can be multiple, since it can be used both as a connection element between a plurality of circuits designed to vary the connection topology thereof and as a switching device for motors or electrical machines.

This semiconductor device comprise at least one substrate (positively or negatively doped), multiple connection pairs, and a plurality of control electrodes.

Each connection pair is preferably provided with a first connection electrode and a second electrode that can be connected (in use connected) to the terminals of one of the loads.

The device also comprises one or more first control electrodes operationally placed between said connection pairs and configured to generate respective first conductive channels between the connection electrodes of the connection pairs following the reception of a pre-set control signal. These first conductive channels arrange the pairs in an initial electrical configuration (i.e. each pair in relation to the other pair or pairs).

One or more second control electrodes operationally placed between said connection pairs (the same) and configured to generate respective second conductive channels between the connection electrodes of the connection pairs, following the reception of a pre-set control signal, are also, preferably, provided. The second conductive channels arrange the pairs in a second electrical configuration.

In this way, two control electrodes are joined to each pair, advantageously enabling a simple variation of a single input (or control) signal to vary the electrical configuration of all the pairs.

It should be noted in this regard that the first and second conductive channels develop between the electrodes of two different connection pairs.

This significantly reduces the number of switches required for controlling, to the benefit of electrical efficiency and reduced overall dimensions.

In each connection pair at least the first or the second connection electrode is preferably joined to both a first and a second control electrode, which is conductive in both the first and the second electrical configuration.

More preferably, said one or more first conductive channels develop between a first connection electrode of a pair and a second connection electrode of another connection pair. Said one or more second conductive channels develop between a first connection electrode of a pair and a corresponding first connection electrode of another connection pair and/or between the second connection electrodes of said pairs.

It should be noted that, preferably, the first control electrodes are positioned so as to arrange at least two connection pairs electrically in series, while the second control electrodes are positioned so as to arrange said two connection pairs electrically in parallel.

According to a preferred aspect of this invention, the semiconductor device is applied within a switching device for an electric motor.

This motor comprises a plurality of phases developing between respective terminals.

Each phase is preferably, but not necessarily, provided with at least one first phase fraction and at least one second phase fraction, each extending between two ends.

Each terminal corresponds to one end of a first or second phase fraction.

The switching device according to this aspect of the invention comprises the semiconductor device described above and at least one control circuit joined to said first and second control electrodes.

This control circuit is, preferably, selectively switched between a first condition, wherein it sends said pre-set control signal to said one or more first control terminals, and a second condition, wherein it sends said pre-set control signal to said one or more second control terminals.

The control circuit can also, preferably, be selectively switched to a third condition (neutral), wherein it does not send any control signal to said one or more first and second control electrodes.

More preferably, said control circuit comprises a voltage generator, a first branch, and a second branch.

The first branch is joined to the voltage generator and connected to said one or more first control electrodes. In addition, the first branch is preferably provided with a first switch that can be selectively switched between a closed and an open position.

The second branch is joined to the voltage generator and connected to said one or more second control electrodes. In addition, the second branch is preferably provided with a second switch that can be selectively switched between a closed and an open position.

The first condition of the control circuit requires that the first switch is in the closed position and the second switch is in the open position.

The second condition of the control circuit requires that the first switch is in the open position and the second switch in the closed position.

Advantageously, it is clear that, thanks to the semiconductor device of the invention, just two switches are enough to control the electric motor in the two different configurations, rather than halving the control and drive signals required in the prior art.

These and other characteristics, together with the related technical benefits, will be clearer from the following illustrative, and therefore non-limiting, description of a preferred, and thus non-exclusive, embodiment of a semiconductor device according to what is illustrated in the attached drawings, wherein.

Figure 1:
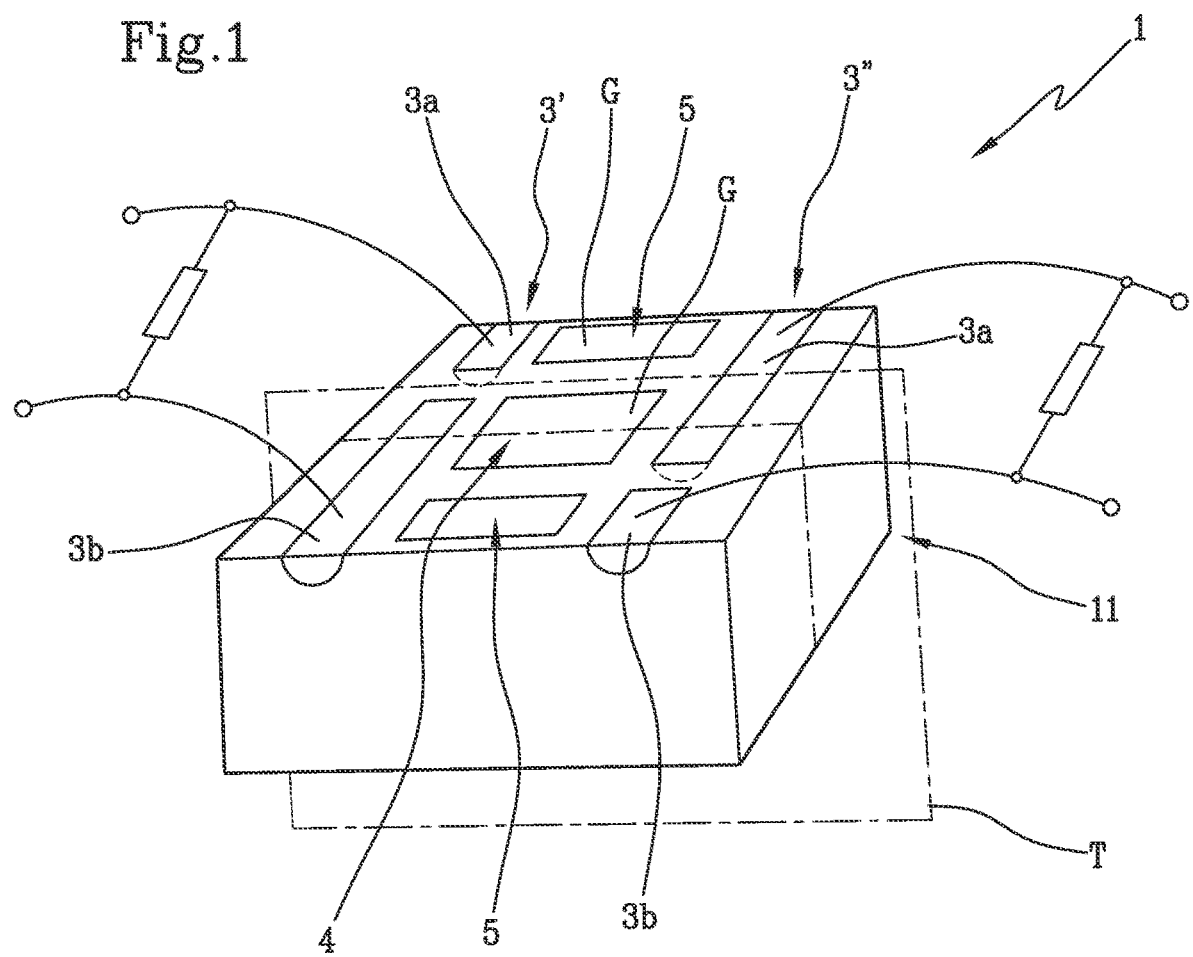
FIG. 1 shows a schematic, perspective view of a semiconductor device according to this invention.
Figure 2:
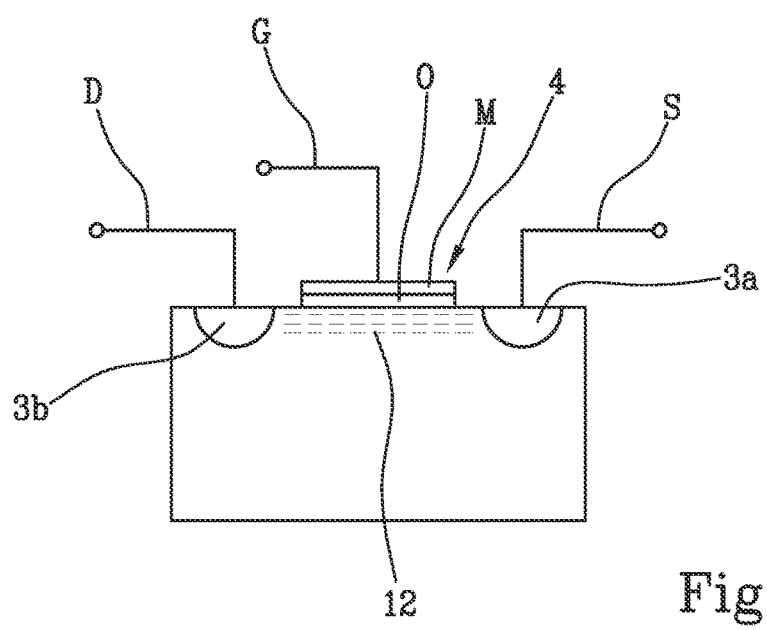
FIG. 2 shows an schematic view in cross-section of the semiconductor device in FIG. 1.
Figure 3:
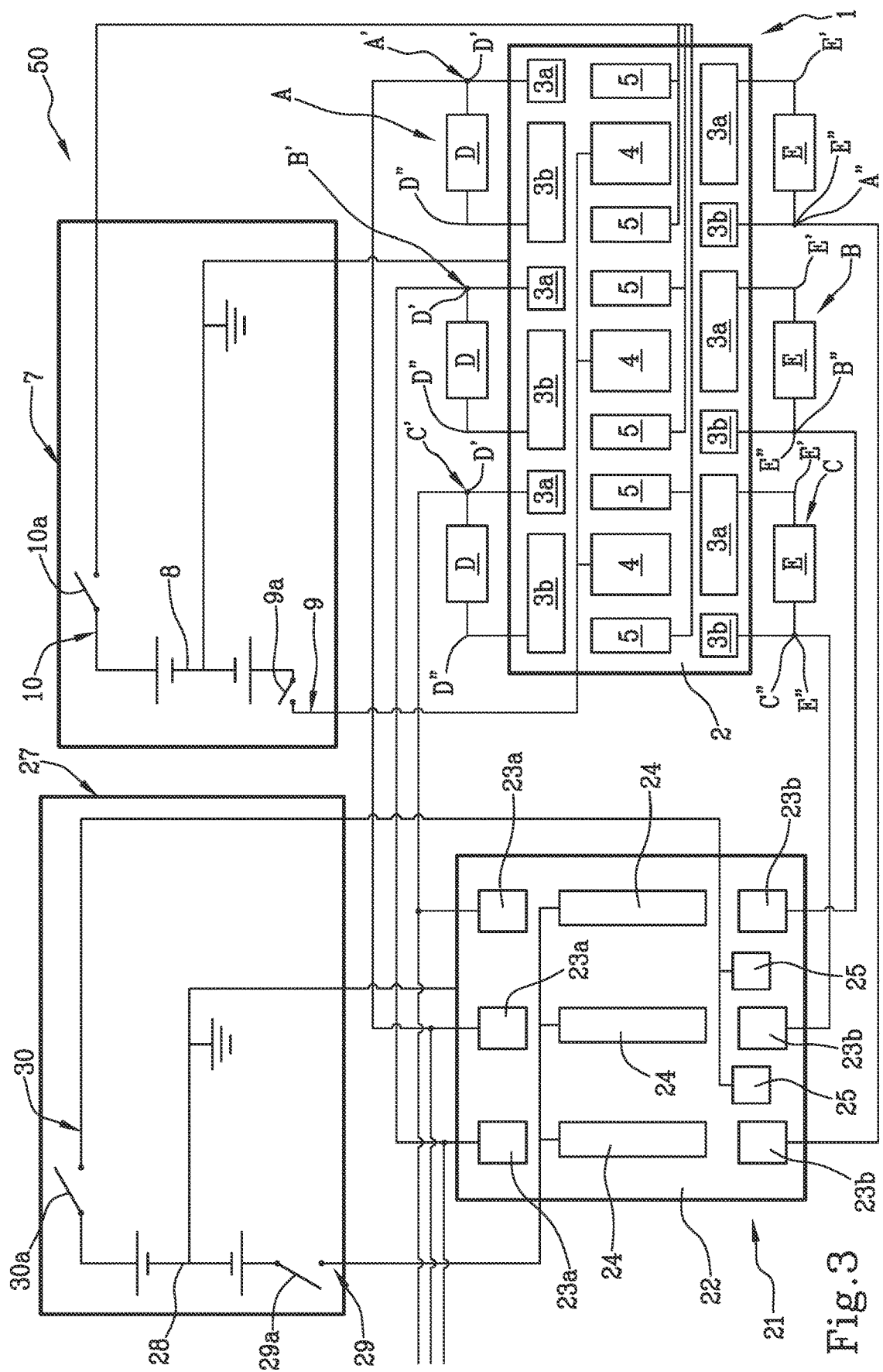
Figure 4:
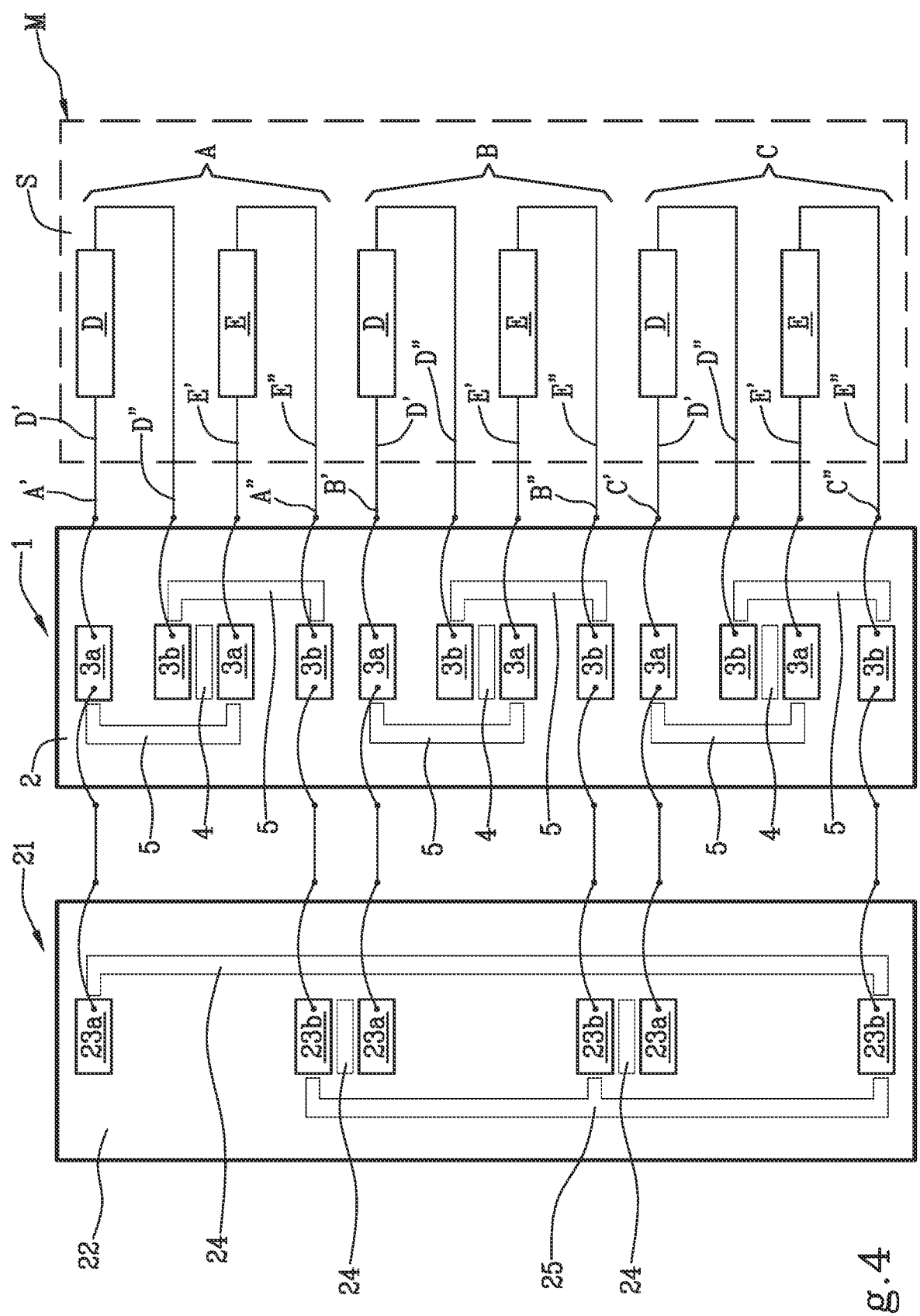

FIG. 3 schematically shows a first possible embodiment of the semiconductor device in FIG. 1 inside a switching device;

FIG. 4 schematically shows a second possible embodiment of a semiconductor device according to this invention.

With reference to the attached figures, the numbers 1 and 21 denote a semiconductor device according to this invention.

The term "semiconductor device", in this text, refers to an electronic device made using a substrate of semiconductor material locally and conveniently doped in order to encourage the selective passage of current.

This device finds application in a great variety of technological sectors, but preferably in uses for which it is necessary to remodel the connection between multiple loads as a function of certain operating needs.

Therefore, the semiconductor device 1 preferably finds application in connecting multiple loads extending between respective terminals that can preferably, but not exclusively, be defined by phase terminals of an electric motor.

The semiconductor device 1, 21 preferably comprises at least one substrate 2, 22 made of a semiconductor material, multiple connection pairs 3, 23, and at least one first 4, 24 and one second control electrode 5, 25.

The substrate 2, 22 is preferably made of silicon, germanium, or gallium arsenide, more preferably of silicon.

This substrate 2, 22 is doped with a pre-set polarity, of the p- or n-type, depending on the embodiment.

The connection pairs 3, 23 are each provided with a first connection electrode 3a, 23a and with a second connection electrode 3b, 23b. Both the connection electrodes 3a, 23a, 3b, 23b are made using local doping 2, 22 with an inverse polarity compared to the substrate 2, 22 and, preferably, overlapping a conductive element or plate.

According to one element of the invention, the device 1 comprises one or more first control electrodes 4, 24 operatively placed between said connection pairs 3, 23 and configured to generate respective one or more first conductive channels 12 between the connection electrodes 3a, 3b, 23a, 23b of two different connection pairs 3, 23 following the reception of a pre-set control signal.

In addition, there should be one or more second control electrodes 5, 25 operationally placed between said connection pairs 3, 23 and configured to generate respective one or more second conductive channels (not illustrated) between the control electrodes 3a, 3b, 23a, 23b of said two different connection pairs 3, 23 following the reception of a pre-set (similar or an additional) control signal.

The control electrodes 4, 24, 5, 25 are preferably defined by a metallic (i.e. conductive) element or plate M overlapping and attached to the substrate 2, 22 with the interposition of a layer of insulating oxide O.

The first conductive channel 12 arranges (or the first conductive channels arrange) the pairs 3, 23 in a first mutual electrical configuration (i.e. the one with respect to the other or others).

The second conductive channel arranges (or the second conductive channels arrange) the pairs 3, 23 in a second mutual electrical configuration (i.e. the one with respect to the other or others).

Advantageously, it is thus possible to simply vary the electrical connection between at least two loads joined to the pairs 2, 23.

In each connection pair 3, 23, at least the first 3a, 23a or the second connection electrode 3b, 23b is preferably joined both to a first 4, 24 and a second control electrode 5, 25, which is conductive in both the first and the second electrical configuration.

More precisely, said one or more first conductive channels 12 extend between a first connection electrode 3a, 23a of a first pair 3, 23 and a second connection electrode 3b, 23b of a second connection pair 3, 23, while said one or more second conductive channels extend between a first connection electrode 3a, 23a of the first pair 3, 23 and a corresponding first connection electrode 3a, 23a of the second connection pair 3, 23 and/or between the second connection electrodes 3b, 23b of said pairs 3, 23.

In other words, said at least two connection pairs 3, 23, the electrodes 3a, 3b, 23a, 23b of the connection pairs 3, 23 and the control electrodes 4, 5 are arranged so that at least one connection electrode of a pair can be selectively connected to both the connection electrodes of the other pair by means, respectively, of the first 12 or second conductive channel, i.e. following the activation of the first 4, 24 or of the second control electrode 5, 25.

Advantageously, in this way the semiconductor device makes it possible not only to determine a selective passage of current between two ends (on-off function), but also makes it possible to conveniently vary the connection diagram between the loads connected to the connection electrodes.

Structurally, therefore, the device 1 preferably comprises multiple field-effect transistors, more preferably of the MOSFET type, each equipped with a drain terminal "d", a source terminal "s", and a gate G.

The drain and source terminals are each defined (or connected) by (or to) a respective connection electrode 3a, 3b, 23a, 23b of a pair 2, 23.

So, for each transistor, the drain terminal is defined by a first connection electrode 3a, 23a and the source terminal is defined by a second connection electrode 3b, 23b or vice versa.

The gates G are, in contrast, defined by (or connected to) a respective first 4, 24 or second control electrode 5, 25 by the substrate 2, 22 and by said layer of insulating oxide O placed between them (thus defining a kind of condenser).

According to one aspect of the invention, thus, there is preferably a number of field-effect transistors on a single semiconductor device 1 equipped with a single substrate 2, 22, at least in part according to the above; each field-effect transistor comprises one of said (source or drain) terminals shared with another field-effect transistor.

In other words, the device 1 preferably comprises at least two field-effect transistors each provided with a respective gate G (i.e. a first 4, 24 or a second control electrode 5, 25) and with respective source and drain terminals, at least one of which is common to both field-effect transistors.

Advantageously, in this way, the semiconductor device 1 encloses in itself a structure that is capable of modifying the connection type between the loads joined to the one or the other connection pair, significantly increasing the application fields thereby.

In use, the semiconductor device 1 is preferably driven by means of at least one control circuit 7, 27 joined to the first 4, 24 and to the second control electrode/s 5, 25.

The assembly of the semiconductor device 1 and the respective control circuit 7, 27 defines, at least in part, a switching device 50, which is also part of this invention.

In order to determine the electrical configuration of the loads attached (connected) to the pairs 3, 23, the control circuit 7, 27 can be selectively switched between a first condition, wherein it sends said pre-set control signal to said one or more first control electrodes 4, 24, and a second condition, wherein it sends said pre-set control signal to said one or more second control electrodes 5, 25.

It should be noted that the "control signal" could, strictly, be the same, irrespective of whether it is sent to the first 4, 24 or to the second control electrode 5, 25.

For example, in fact, the generation of the first 12 or second conductive channel in the substrate 2, 22 is preferably consequent to the application of the same level of voltage to the first 4, 24 or to the second control electrode 5, 25, respectively.

In the preferred embodiment, in fact, the control circuit 7, 27 has the same voltage generator 8, 28 joined to two different branches, each joined to a first 4, 24 or to a second control electrode 5, 25.

The term "branch" is intended, here, to define a portion of circuit, however it is made, that runs from the voltage generator 8, 28 to the first 4, 24 or to the second control electrode 5, 25.

There are also switching means that are configured to determine the passage of current alternately in one branch, directly to the first control electrode 4, 24, or in the other, directly to the second control electrode 5, 25.

More specifically, the control circuit 8, 28 comprises, in addition to the voltage generator 8, 28, a first branch 9, 29 and a second branch 10, 30.

The first branch 9, 29 is joined to the voltage generator 8, 28, connected to said one or more first control electrodes 4, 24, and equipped with a first switch 9a, 29a that can be selectively switched between a closed and an open position;

The second branch 10, 30 is joined to the voltage generator 8, 28, connected to said one or more second control electrodes 5, 25 and equipped with a second switch 10a, 30a that can be selectively switched between a closed and an open position.

In the first condition of the control circuit 7, 27, the first switch 9a, 29a is preferably in the closed position and the second switch 10a, 30a is in the open position.

In accordance with this, in the second condition of the control circuit 7, 27, the first switch 9a, 29a is preferably in the open position and the second switch 10a, 30a in the closed position.

Alternatively, however, the structure of the control circuit could be different, for example, with a single switch that can be switched between two positions, one corresponding to the first electrical configuration and one corresponding to the second electrical configuration.

It should be noted that, preferably, the control circuit 7, 27 can also be selectively switched to a third condition, wherein it does not send any control signal, neither to the first 4, 24 nor to the second control electrodes 5, 25.

In the preferred embodiment, the third condition is determined by the positioning of both the switches 9a, 29a, 10a, 30a in the open position.

In other words, therefore, the third condition of the control circuit 7, 27 is a neutral position, wherein the two loads are not connected to each other and, thus, can be used independently, which is very advantageous in some applications.

By way of non-limiting example, the switching device 50 described above could be used in controlling an electric motor 100, preferably, but not exclusively, for use in traction.

It should be noted that, complementarily or alternatively to what is described above, the electric motor 100 is also to be considered part of the invention.

This electric motor 100 comprises a stator body, or stator S, and a rotor body, or rotor (not illustrated), which is rotatably joined to the stator 101 to rotate about its own rotation axis.

It should be noted that the stator body S is preferably housed inside a casing or containment body (not illustrated).

The stator body S is provided with a prismatic casing extending along said rotation axis and containing a number of phases A, B, C angularly spaced apart and defined by respective windings.

The phases can be of various kinds, both defined by bar conductors and by ° conventional" wire/coil windings.

The electric motor 100 is, therefore, of the multiphase type, i.e. comprising a number of phases ranging from two and increasing depending on the type or application.

In the preferred embodiment, however, the electric motor 100 is at least a three-phase motor.

In the embodiment illustrated (for illustrative purposes only), the stator S comprises at least a first A, a second B, and a third phase C.

The phases, regardless of how many there are, develop between respective terminals A', A", B', B", C', C".

In the preferred embodiment, in addition, the electric motor 100 preferably has fractionated phases.

Each phase A, B, C is, therefore, preferably provided with at least one first phase fraction D and at least one second phase fraction E.

The first D and the second phase fraction E each extend between two ends D', D", E', E"; it should be noted that, in this respect, each terminal A', A", B', B", C', C" of a respective phase A, B, C corresponds to an end D', E" of a first D or second phase fraction E.

More precisely, a first end D' of the first phase fraction D and a second end E" of the second phase fraction E correspond, respectively, to a first A', B', C' and a second terminal A", B", C" of the corresponding first A, second B, or third phase A.

According to this aspect of the invention, the phases A, B, C and/or the phase fractions D, E of each phase can be connected together in a suitable way in order to vary the operating configuration of the electric motor 100.

In this respect, there is a switching device 50, wherein the connection electrodes 3, 23 of the semiconductor device 1 are connected to a respective terminal A', A", B', B", C', C" of a phase A, B, C or end D', D", E', E" of a phase fraction D, E.

It is precisely in this application (editor's note: electric motor) that the (preferential) arrangement of a switchable control circuit is particularly advantageous, even in the third, neutral condition.

In fact, in electrical traction applications the neutral condition means that the stator phases are non-conductive.

Advantageously, this makes it possible to run the motor in idle, for example, keeping the rotor firmly attached to the vehicle's wheel assembly without the need to introduce a clutch or disconnect clutch to operate when the electric motor is not operating.

With reference to a preferred embodiment of the semiconductor device 1, illustrated in FIG. 1, the first control electrodes 4, 24 are positioned so as to arrange at least two connection pairs 3', 3" electrically in series, while the second control electrodes 5, 25 are positioned so as to arrange said two connection pairs 3', 3" electrically in parallel.

In this embodiment, for example, the device comprises a first connection pair 3' and a second connection pair 3", each provided with a first 3a and a second connection electrode 3b.

There is also at least one first control electrode 4 arranged between the first connection electrode 3a of the first pair 3' and the second connection electrode 3b of the second pair 3".

Again with reference to this embodiment, the device 1 comprises two second control electrodes 5 (electrically connected to each other) placed respectively between the first two connection electrodes 3a of the first 3' and the second pair 3" and between the second connection electrodes 3b of the first 3' and the second pair 3".

Advantageously, this layout enables the device 1 to be rationally designed, making it particularly suitable for all those applications in which it is necessary to vary the connection between two circuits in series/parallel, such as, for example, the windings of an electric motor with a variable configuration.

It should be noted that, preferably, in this embodiment, the two connection pairs 3', 3" face each other, with a first 3a and a second connection electrode 3b, respectively, with increased extension so that they face each other.

The first 4 and the second control electrodes 5 extend between respective connection electrodes 3a, 3b so that, at the reception of the control signal, they create respective first 12 or second conductive channels between said electrodes.

It should be remembered that the control signal is preferably a voltage value measured between a first 4, 24 or a second control electrode 5, 25 and the substrate 2, 22.

With reference, for example to the embodiment in FIG. 3, the semiconductor device 1 preferably comprises three operating units 11 each of which can be joined to a corresponding phase A, B, C of the electric motor 100 and comprising at least two connection pairs 3, 23, each of which can be joined to a phase fraction D, E of the corresponding phase A, B, C.

An example of the operating unit 11 was illustrated above and is shown in FIG. 1.

The operating units may be either discrete (physically separate) or, as shown in FIGS. 3 and 4, integrated into a single substrate 2 of the semiconductor device 1.

Alternatively, however, the semiconductor device may take on a different configuration, again illustrated in FIGS. 3 and 4 and identified by the number 21.

In this embodiment, which is particularly advantageous when coupled with a multiphase electric motor, the device 21 comprises three connection pairs 23, each of which can be joined to a phase A, B, C of said electric motor.

The first control electrodes 24 are preferably positioned in such a way that they connect the connection pairs 23 together according, alternatively, to a triangular configuration and a star configuration, respectively defining the first and the second electrical configuration of the pairs 23.

Thus, in certain embodiments, the semiconductor device 1 can advantageously be used to vary the electrical configuration of the individual phases, while in other embodiments, the semiconductor device 21 can be used to vary the mutual connection between the phases.

In this respect, according to a preferred embodiment, newly illustrated in FIGS. 3 and 4, the switching device 50 could comprise both the semiconductor devices 1, 21 described above, so as to be able to vary the configuration of the electric motor 100 according to multiple different combinations.

In this embodiment, for example, the electric motor 100 comprises a first A, a second B, and a third phase C each of which is divided into a number of phase fractions D, E.

The switching device 50 preferably comprises a first operating module 51 and a second operating module 52, preferably arranged between them in series.

The first operating module 51 is equipped with the (first) semiconductor device 1 joined to the (first) control circuit 7 and comprising the three operating units 11 described above.

In other words, each operating unit 11 is joined (or can be joined) to a respective phase A, B, C of the electric motor 100 and comprises at least two connection pairs 3 each of which can be joined to a fraction of the respective phase A, B, C.

The first 4 and second control electrodes 5 are respectively positioned so as to arrange the connection pairs 3 of each unit 11 electrically in series and parallel between them, defining, respectively, the first and second electrical configuration of the pairs 3 of the (first) semiconductor device 1.

The second operating module 52 comprises, instead, the (second) semiconductor device 21 joined to the (second) control circuit 27.

The (second) semiconductor device 21 comprises three connection pairs 23 each of which can be joined to a phase A, B, C of the electric motor 100, wherein the respective first 24 and second control electrodes 25 are respectively positioned in such a way that the connection pairs 23 are connected together according to a triangular and a star configuration that, as described above, define the first and second electrical configuration of the pairs 23 of the second semiconductor device 21.

Advantageously, thanks to the combination of the two semiconductor devices 1, 21 (which could be integrated into a single substrate) conveniently controlled, it is possible to vary the configuration of the electric motor 100 in multiple configurations.

These operating configurations preferably include at least the following:
- a triangular-series configuration, in which both the connection pairs 3 of the first semiconductor device 1 and the connection pairs 23 of the second semiconductor device 21 are in the first electrical configuration;
- a triangular-parallel configuration, wherein the connection pairs 3 of the first semiconductor device 1 are in the second electrical configuration and the connection pairs 23 of the second semiconductor device 21 are in the first electrical configuration;
- a star-series configuration, wherein the connection pairs 3 of the first semiconductor device 1 are in the first electrical configuration and the connection pairs 23 of the second semiconductor device 21 are in the second electrical configuration;
- a star-parallel configuration, wherein both the connection pairs 3 of the first semiconductor device 1 and the connection pairs 23 of the second semiconductor device 21 are in the second electrical configuration.

Thus, advantageously, just two commands (which could be reduced to one) imparted by the respective control circuits are enough to determine as many as four different electrical configurations of the stator phases, corresponding to four separate application fields able to maximise the efficiency area of the motor.

The invention achieves its intended purposes and significant advantages are thus obtained.

In fact, the design of a semiconductor device suitable for determining a different connection between the loads connected to it as a function of a single control signal makes it possible to considerably simplify all those applications wherein it is necessary to control several loads simultaneously.

In particular, the use of this semiconductor device in a switching device of an electric machine with a variable configuration makes it possible to combine the thermal and electrical efficiency requirements with those related to switching speed and overall dimensions, thus defining an optimal solution to all the problems found in the prior art.

The invention claimed is:

1. A switching device for an electric motor, said motor comprising a plurality of phases developing between respective terminals; said switching device comprising:
    at least one semiconductor device for connecting the terminals of said phases; said at least one semiconductor device comprising:
        at least one substrate;
        a plurality of connection pairs, each including a first connection electrode and a second connection electrode, connectable to the terminals of a phase;
        one or more first control electrodes operatively placed between said connection pairs and configured to create respective first conductive channels between the connection electrodes of two different ones of the connection pairs at the reception of a pre-set control signal sent to the one or more first control electrodes; said first conductive channels arranging said connection pairs in a first electrical configuration;
        one or more second control electrodes operatively placed between said connection pairs and configured to create respective second conductive channels between the connection electrodes of said two different ones of the connection pairs at the reception of a pre-set control signal sent to the one or more second control electrodes; said second conductive channels arranging said connection pairs in a second electrical configuration; and
    at least one control circuit joined to said one or more first and second control electrodes and configured to be selectively switched between a first condition, wherein the at least one control circuit sends said pre-set control signal to said one or more first control electrodes, and a second condition, wherein the at least one control circuit sends said pre-set control signal to said one or more second control electrodes.

2. The switching device according to claim 1, wherein, in each of the connection pairs, at least the first or the second connection electrode is joined to both a first and a second control electrode of the one or more first and second control electrodes, which is conductive in both the first and the second electrical configuration.

3. The switching device according to claim 1, wherein:
    said one or more first conductive channels develop between a first connection electrode of one of the connection pairs and a second connection electrode of another of the connection pairs;
    said one or more second conductive channels develop between a first connection electrode of one of the connection pairs and a corresponding first connection electrode of another of the connection pairs and/or between the second connection electrodes of said connection pairs.

4. The switching device according to claim 1, wherein:
    said one or more first control electrodes configured to arrange at least two of the connection pairs electrically in series with each other;
    said one or more second control electrodes are configured to arrange two of the connection pairs electrically in parallel with each other.

5. The switching device according to claim 1, wherein the pre-set control signal sent to the one or more first second control electrodes and/or sent to the one or more second control electrodes; is a voltage value measured between a first or a second control electrode of the one or more first or second control electrodes and the at least one substrate.

6. The switching device according to claim 1, and further comprising a plurality of gates each being defined by a respective one of the first or second control electrodes, the at least one substrate, and a layer of insulating oxide.

7. The switching device according to claim 6, and further comprising a plurality of field-effect transistors each including a drain terminal, a source terminal, and one of said gates defined respectively by one of said first connection electrodes, one of said second connection electrodes, and one of said one or more first or second control electrodes; each field-effect transistor comprising one of said terminals shared with another field-effect transistor.

8. The switching device according to claim 1, wherein said at least one control circuit is selectively switchable to a third condition, wherein the at least one control circuit does not send any control signal to said one or more first and second control electrodes.

9. The switching device according to claim 1, wherein said at least one control circuit comprises:
a voltage generator;
a first branch joined to the voltage generator, connected to said one or more first control electrodes and including a first switch selectively switchable between a closed and an open position;
a second branch joined to the voltage generator, connected to said one or more second control electrodes and including a second switch selectively switchable between a closed and an open position, wherein:
in said first condition of the at least one control circuit the first switch is in the closed position and the second switch is in the open position;
in said second condition of the at least one control circuit the first switch is in the open position and the second switch in the closed position.

10. The switching device according to claim 8, wherein said third condition of the at least one control circuit requires that the first switch and the second switch are in the open position.

11. The switching device according to claim 1, wherein the at least one semiconductor device comprises three operating units each of which is joinable to a corresponding phase of the electric motor and comprising at least two of the connection pairs, each of which is joinable to a phase fraction of the corresponding phase, and wherein:
said one or more first control electrodes are positioned to arrange the connection pairs of each operating unit electrically in series, defining said first electrical configuration of the connection pairs;
said one or more second control electrodes are positioned to arrange the connection pairs of each operating unit electrically in parallel, defining said second electrical configuration of the connection pairs.

12. The switching device according to claim 1, wherein the at least one semiconductor device comprises three of the connection pairs each of which is joinable to a phase of said electric motor, and wherein:
said one or more first control electrodes are positioned to connect the connection pairs together according to a triangular configuration, defining said first electrical configuration of the connection pairs;
said one or more second control electrodes are positioned to connect the connection pairs together according to a star configuration, defining said second electrical configuration of the connection pairs.

13. The switching device according to claim 1, wherein the electric motor comprises a first, a second, and a third phase each divided into a plurality of phase fractions; said switching device comprising:

the at least one semiconductor device including a first semiconductor device and a second semiconductor device;
the at least one control circuit including a first control circuit and a second control circuit;
the first semiconductor device joined to the first control circuit comprising three operating units each of which is joinable to a corresponding phase of the electric motor and comprising at least two of the connection pairs each of which is joinable to a phase fraction of the corresponding phase, wherein said one or more first and second control electrodes are respectively positioned to arrange the connection pairs of each unit electrically in series and parallel to each other, defining respectively said first and said second electrical configuration of the connection pairs of the first semiconductor device;
the second semiconductor device joined to the second control circuit, arranged in series with said first semiconductor device and comprising three of the connection pairs each of which is joinable to a phase of said electric motor, wherein said one or more first and said second control electrodes are respectively positioned to arrange the connection pairs together according to a triangular and a star configuration, defining said first and said second electrical configuration of the connection pairs of the second semiconductor device.

14. An electric motor, comprising:
a rotor body that is rotatable about a first rotation axis;
a stator body including a prismatic casing developing along said rotation axis and containing a plurality of phases developing between respective terminals, wherein each phase includes at least one first phase fraction and at least one second phase fraction; said at least one first and second phase fractions each developing between two ends, wherein each of the terminals corresponds to one end of the at least one first or second phase fractions;
the switching device according to claim 1, wherein each of the first and second connection electrodes electrode is connected to a respective end of the at least one first or second phase fractions.

15. An electric motor, comprising:
a rotor body that is rotatable about a first rotation axis;
a stator body including a prismatic casing developing along said rotation axis and containing a plurality of phases developing between respective terminals;
the switching device according to claim 10, wherein each of the first and second connection electrodes is connected to a respective terminal of one of the phases.

16. The switching device according to claim 1, wherein the pre-set control signal sent to the one or more second control electrodes is the same pre-set control signal sent to the one or more first control electrodes.

17. The switching device according to claim 1, wherein the pre-set control signal sent to the one or more second control electrodes is different from the pre-set control signal sent to the one or more first control electrodes.

* * * * *